(12) United States Patent
Yoon et al.

(10) Patent No.: US 12,713,667 B2
(45) Date of Patent: Aug. 18, 2026

(54) DIELECTRIC STRUCTURE AND SUBSTRATE PROCESSING APPARATUS INCLUDING THE SAME

(71) Applicant: Samsung Electronics Co., Ltd., Suwon-si (KR)

(72) Inventors: Sungyoung Yoon, Suwon-si (KR); Jonghwa Shin, Daejeon (KR); Minyeul Lee, Daejeon (KR); Sungyeol Kim, Suwon-si (KR); Taekjin Kim, Suwon-si (KR); Meehyun Lim, Suwon-si (KR); Sungyong Lim, Suwon-si (KR)

(73) Assignees: Samsung Electronics Co., Ltd., Gyeonggi-do (KR); Korea Advanced Institute of Science And Technology, Daejeon (KR)

( * ) Notice: Subject to any disclaimer, the term of this patent is extended or adjusted under 35 U.S.C. 154(b) by 343 days.

(21) Appl. No.: 18/507,606

(22) Filed: Nov. 13, 2023

(65) Prior Publication Data

US 2024/0274661 A1 Aug. 15, 2024

(30) Foreign Application Priority Data

Feb. 9, 2023 (KR) ........................ 10-2023-0017398

(51) Int. Cl.
*H01L 29/06* (2006.01)
*H01J 37/32* (2006.01)
*H10D 62/10* (2025.01)

(52) U.S. Cl.
CPC ........ *H10D 62/117* (2025.01); *H01J 37/3244* (2013.01); *H10D 62/126* (2025.01)

(58) Field of Classification Search
CPC ...... H10D 84/212; H10D 84/217; H10D 1/41; H10D 1/68; H10D 1/692; H10D 80/215; H10D 86/481; H10D 86/80; H10D 86/85
See application file for complete search history.

(56) References Cited

U.S. PATENT DOCUMENTS 6,459,562 B1 * 10/2002 KarRoy ............ H01L 21/76826 257/295
11,076,489 B2 7/2021 Flemming et al.
(Continued)

FOREIGN PATENT DOCUMENTS

JP 2020-145413 A 9/2020
KR 10-2020-0009732 A 1/2020
(Continued)

OTHER PUBLICATIONS

Korean Intellectual Property Office, Request for the Submission of an Opinion, Korean Pat. App. No. 10-2023-0017398, May 13, 2026, all pages. (Year: 2026).*
(Continued)

*Primary Examiner* — Victoria K. Hall
(74) *Attorney, Agent, or Firm* — Harness, Dickey & Pierce, P.L.C.

(57) ABSTRACT

A dielectric structure may include: an insulating layer extending in a first direction; a plurality of conductor layers disposed on a first surface of the insulating layer and spaced apart from each other in the first direction; at least one semiconductor layer disposed on a second surface of the insulating layer, opposite to the first surface, and overlapping each of at least two conductor layers adjacent to each other among the plurality of conductor layers in a second direction intersecting the first direction; a first protective layer covering the plurality of conductor layers on the first surface of the insulating layer; and a second protective layer covering the at least one semiconductor layer on the second surface of the insulating layer.

20 Claims, 7 Drawing Sheets

(56) References Cited

U.S. PATENT DOCUMENTS

| | | | | |
|---|---|---|---|---|
| 2005/0167722 | A1* | 8/2005 | Won | H10D 84/217 257/311 |
| 2008/0157762 | A1 | 7/2008 | Weiss | |
| 2014/0183698 | A1* | 7/2014 | Hsu | H10D 1/68 257/532 |
| 2020/0027663 | A1 | 1/2020 | Seong et al. | |
| 2020/0058441 | A1 | 2/2020 | Altenhoven et al. | |
| 2020/0234992 | A1* | 7/2020 | Hoescheler | H10P 72/722 |
| 2021/0013009 | A1 | 1/2021 | Oliveti et al. | |
| 2021/0151292 | A1 | 5/2021 | Kishida et al. | |
| 2022/0093369 | A1 | 3/2022 | Lee et al. | |
| 2022/0367444 | A1* | 11/2022 | Higgins | H10D 1/47 |
| 2023/0361133 | A1* | 11/2023 | Zhao | H10D 86/423 |
| 2024/0312822 | A1* | 9/2024 | Lee | B23Q 3/15 |

FOREIGN PATENT DOCUMENTS

| | | | |
|---|---|---|---|
| KR | 10-2145746 | B1 | 8/2020 |
| KR | 10-2325544 | B1 | 11/2021 |
| KR | 10-2360909 | B1 | 2/2022 |
| KR | 10-2022-0040804 | A | 3/2022 |
| KR | 10-2370709 | B1 | 3/2022 |
| KR | 10-2022-0128163 | A | 9/2022 |

OTHER PUBLICATIONS

Office Action issued May 13, 2026 in Korean Application No. 10-2023-0017398.

* cited by examiner

DIELECTRIC STRUCTURE AND SUBSTRATE PROCESSING APPARATUS INCLUDING THE SAME

CROSS-REFERENCE TO RELATED APPLICATION(S)

This application claims benefit of priority to Korean Patent Application No. 10-2023-0017398 filed on Feb. 9, 2023, in the Korean Intellectual Property Office, the disclosure of which is incorporated herein by reference in its entirety.

BACKGROUND

The present disclosure relates to a dielectric structure and a substrate processing apparatus including the same.

In order to manufacture a semiconductor device, a series of processes such as deposition, etching, and cleaning are required. These processes may be performed through substrate processing apparatuses such as a deposition device, an etching device, or a cleaning device using plasma formed in a chamber. Technology for controlling asymmetry of plasma in the substrate processing apparatus is being developed.

SUMMARY

An aspect of the present disclosure is to provide a dielectric structure configured to control a dielectric constant.

In addition, another aspect of the present disclosure is to provide a substrate processing apparatus configured to improve asymmetry of plasma.

According to an aspect of the present disclosure, a dielectric structure including: an insulating layer extending in a first direction; a plurality of conductor layers disposed on a first surface of the insulating layer such that the plurality of conductive layers are spaced apart from each other in the first direction; at least one semiconductor layer on a second surface of the insulating layer, opposite to the first surface, and overlapping each of at least two adjacent conductor layers, among the plurality of conductor layers, in a second direction intersecting the first direction; a first protective layer covering the plurality of conductor layers on the first surface of the insulating layer; and a second protective layer covering the at least one semiconductor layer on the second surface of the insulating layer.

In addition, according to another aspect of the present disclosure, a dielectric structure including: an insulating layer; a plurality of conductor layers disposed on a first surface of the insulating layer such that the plurality of conductive layers are spaced apart from each other by a first distance in a first direction; at least one semiconductor layer between at least two adjacent conductor layers, among the plurality of conductor layers, and on a second surface of the insulating layer, opposite to the first surface, the at least one semiconductor layer having a width greater than the first distance in the first direction; a first protective layer covering the plurality of conductor layers on the first surface of the insulating layer; and a second protective layer covering the at least one semiconductor layer on the second surface of the insulating layer.

In addition, according to another aspect of the present disclosure, a dielectric structure including: an insulating layer; a plurality of conductor layers disposed on a first surface of the insulating layer such that the plurality of conductive layers are spaced apart from each other in a first direction; at least one semiconductor layer disposed on a second surface of the insulating layer, opposite to the first surface, and overlapping at least two adjacent conductor layers, among the plurality of conductor layers, in a second direction perpendicular to the first direction such that the at least one semiconductor layer and the adjacent conductive layers are configured to form an internal electrical field when an external electric field is applied in the first direction; and protective layers covering the plurality of conductor layers and the at least one semiconductor layer on the first surface and the second surface of the insulating layer.

According to example embodiments of the present disclosure, a dielectric structure configured to control dielectric constant and capacitance may be provided by disposing a patterned conductor layer and a semiconductor layer in an insulating layer.

In addition, according to example embodiments of the present disclosure, there is provided a substrate processing apparatus through which asymmetry of plasma is improved by the dielectric structure.

Advantages and effects of the present application are not limited to the foregoing content and may be more easily understood in the process of describing a specific example embodiment of the present disclosure.

BRIEF DESCRIPTION OF DRAWINGS

The above and other aspects, features, and advantages of the present disclosure will be more clearly understood from the following detailed description, taken in conjunction with the accompanying drawings, in which:

FIG. 2B is a plan view illustrating a dielectric structure of a modified example;

DETAILED DESCRIPTION

Figure 1:
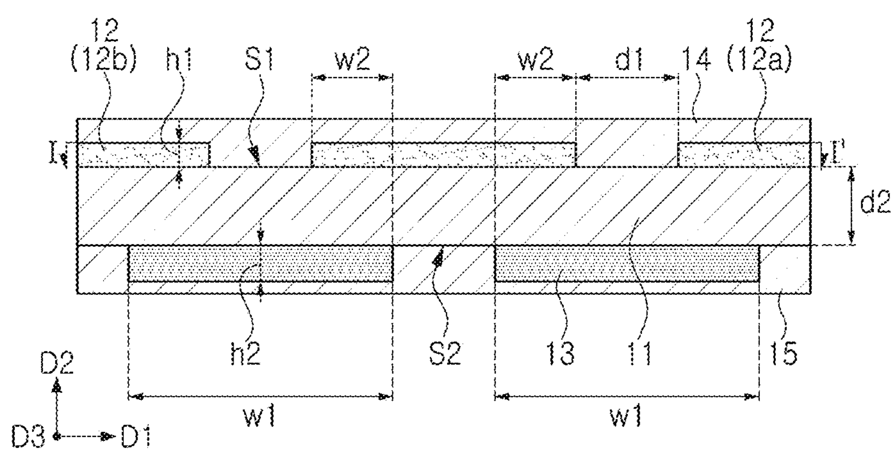
FIG. 1 is a cross-sectional view schematically illustrating a dielectric structure according to at least one embodiment of the present disclosure.

Hereinafter, example embodiments of the present disclosure will be described with reference to the accompanying drawings wherein like reference numerals refer to like elements throughout. In this regard, the present embodiments may have different forms and should not be construed as being limited to the descriptions set forth herein.

In the drawings, sizes of constituent elements may be exaggerated for convenience of explanation and the clarity of the specification. In the following drawings, the size of each component in the drawings may be exaggerated for clarity and convenience of description. Additionally, although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure. In addition, the embodiments described below are an example only, and can be subjected to various modifications.

Additionally, when the terms "about" or "substantially" are used in this specification in connection with a numerical value and/or geometric terms, it is intended that the associated numerical value includes a manufacturing tolerance (e.g., ±10%) around the stated value and/or term, unless indicated otherwise. Further, regardless of whether numerical values and/or geometric terms are modified as "about" or "substantially." it will be understood that these values should be construed as including a manufacturing or operational tolerance (e.g., ±10%) around the stated numerical values and/or geometry. When referring to "within" and/or "C to D", this means C inclusive to D inclusive unless otherwise specified. Also, embodiments described herein may have different forms and should not be construed as being limited to the descriptions set forth herein.

It will also be understood that when an element is referred to as being "on" or "above" another element, the element may be in direct contact with the other element or other intervening elements may be present. It will also be understood that spatially relative terms, such as "above", "top", etc., are intended to encompass different orientations of the device in use or operation in addition to the orientation depicted in the figures, and that the device may be otherwise oriented (rotated 90 degrees or at other orientations) and the spatially relative terms used herein interpreted accordingly.

FIG. 1 is a cross-sectional view schematically illustrating a dielectric structure 10 according to at least one embodiment of the present disclosure.

Figure 2A:
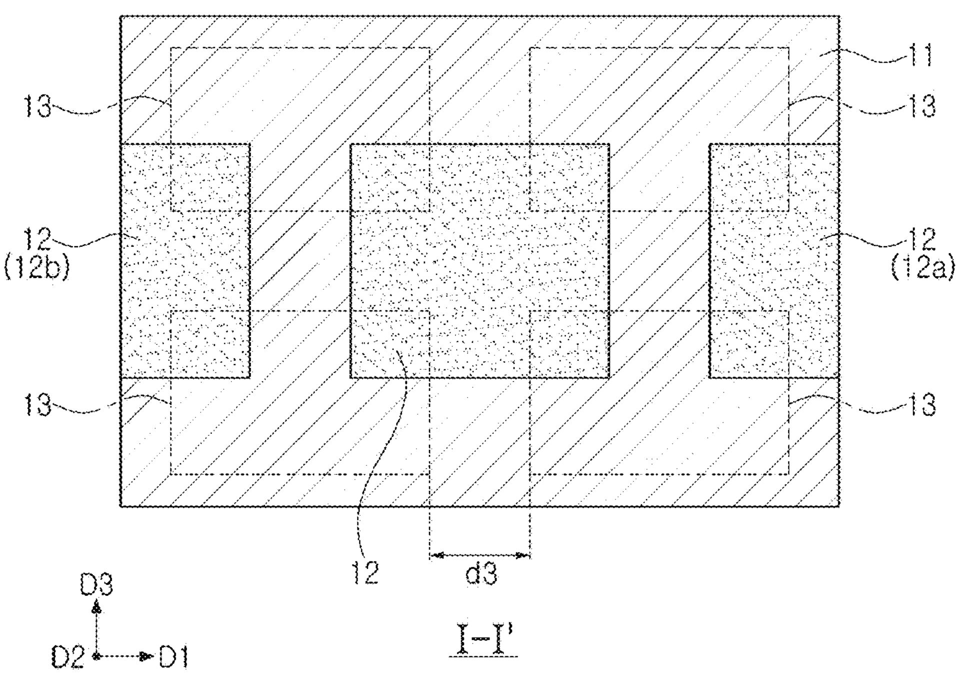
FIGS. 2A and 2B are a plan view illustrating a surface taken along line I-I' of FIG. 1.
Figure 2B:
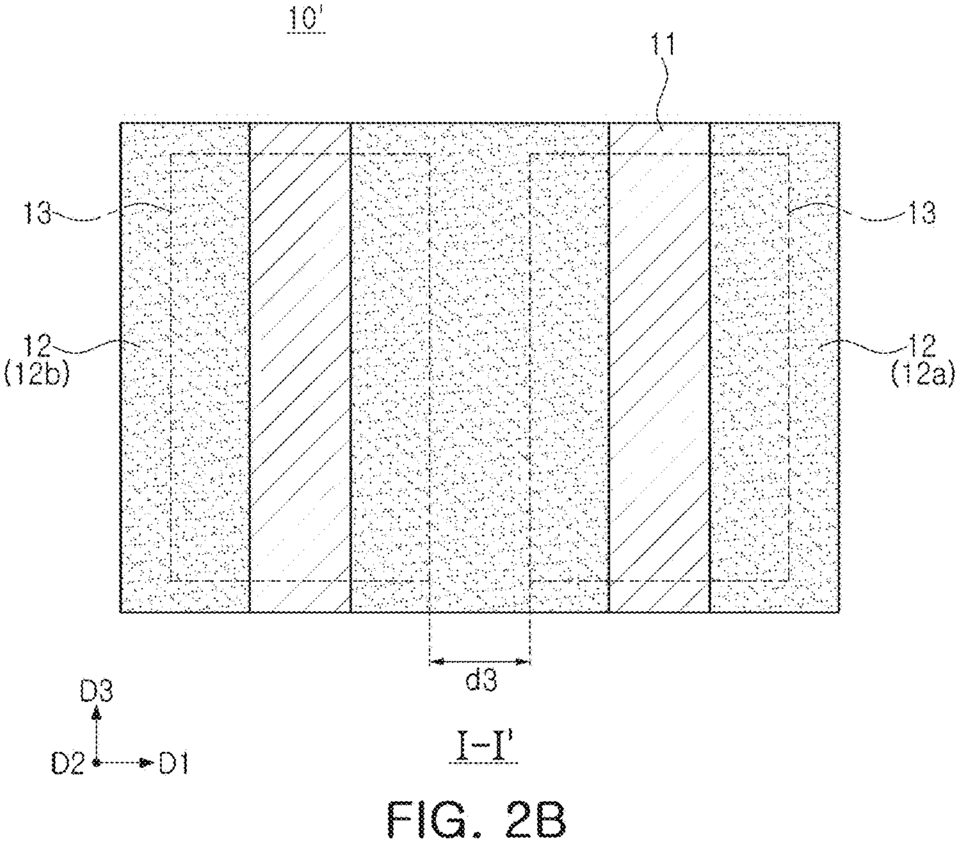

FIG. 2A is a plan view illustrating a surface taken along line I-I' of FIG. 1, and FIG. 2B is a plan view illustrating a dielectric structure 10' of a modified example. FIG. 2B illustrates a cut surface of the dielectric structure 10' of the modified example corresponding to FIG. 2A.

Referring to FIGS. 1, 2A and 2B, the dielectric structure 10 may include an insulating layer 11, a plurality of conductor layers 12, at least one semiconductor layer 13, and protective layers 14 and 15.

The insulating layer 11 may extend in a first direction D1 and may have a first surface S1 and a second surface S2, opposite to each other. The insulating layer 11 may electrically and physically separate the plurality of conductor layers 12 from the semiconductor layer 13 in a second direction D2. The insulating layer 11 may have a predetermined (and/or otherwise set) thickness to electrically insulate the plurality of conductor layers 12 from the semiconductor layer 13. A distance between the plurality of conductor layers 12 and the semiconductor layer 13 spaced apart from each other by the insulating layer 11 (hereinafter referred to as 'a second distance d2') may be about 3 μm or more, for example, in a range of about 3 μm to about 10 μm, about 3 μm to about 8 μm, and/or about 3 μm to about 5 μm. However, the present disclosure is not limited thereto, and a distance between the plurality of conductor layers 12 and the semiconductor layer 13 (hereinafter referred to as 'a second distance d2') may be less than about 3 μm depending on a material of the insulating layer 11 and/or a thickness of the insulating layer 11. The insulating layer 11 may include a material having light-transmitting and insulating properties. In at least one embodiment, the material may be selected as a material with light-transmitting properties for at least one wavelength (or a range of wavelengths) of light. The light may include wavelengths of greater than, less than, and/or included in the visual spectrum. For example, the insulating layer 11 may comprise a transparent and/or translucent insulator. The insulation layer 11 may be formed using chemical vapor deposition (CVD), physical vapor deposition (PVD), atomic layer deposition (ALD), and/or the like. For example, in at least one example, the insulating layer 11 may include an insulating thin film layer (e.g., silica ($SiO_2$)) deposited by a plasma enhanced CVD (PECVD).

The plurality of conductor layers 12 may be disposed on the first surface S1 of the insulating layer 11 such that the plurality of conductor layers 12 extend in an extending direction of the insulating layer 11, for example, in the first direction D1. The plurality of conductor layers 12 may be configured to be polarized in the first direction D1 by an external electric field (e.g., 'E' in FIGS. 3A and 3B). The plurality of conductor layers 12 may be spaced apart from each other by a predetermined (and/or otherwise set) distance (hereinafter, referred to as a 'first distance d1') in the first direction D1. The first distance d1 may be determined in consideration of a material and thickness of the plurality of conductor layers 12, a material and/or thickness of the insulating layer 11, and a capacitance of the dielectric structure 10. For example, the first distance d1 may be in a range of about 10 μm to about 150 μm, about 20 μm to about 120 μm, about 30 μm to about 110 μm, and/or about 40 μm to about 100 μm, but the present disclosure is not limited thereto.

The plurality of conductor layers 12 may include a first conductor layer **12*a* and a second conductor layer 12*b* exposed from both ends of a first protective layer 14. However, the present disclosure is not limited thereto, and according to at least one embodiment, the first conductor layer 12*a* and the second conductor layer 12*b*** may not be exposed to the outside.

A thickness h1 of the plurality of conductor layers 12 may be equal to or less than a thickness h2 of at least one semiconductor layer 13, but the present disclosure is not limited thereto. The thickness h1 of the plurality of conductor layers 12 and the thickness h2 of at least one semiconductor layer 13 may be determined in consideration of the capacitance of the dielectric structure 10. A plurality of conductor layers 12 may include conductive materials such as aluminum (Al), gold (Au), cobalt (Co), copper (Cu), nickel (Ni), lead (Pb), tantalum (Ta), tellurium (Te), titanium (Ti), tungsten (W), a combination thereof, and/or the like. The plurality of conductor layers 12 may be formed using a plating process, PVD, CVD, ALD, and/or the like.

The at least one semiconductor layer 13 may be disposed on the second surface S2 of the insulating layer 11 and may extend in the extending direction of the insulating layer 11, for example, in the first direction D1. The at least one semiconductor layer 13 may be combined with the plurality of conductor layers 12 polarized in the first direction D1 by the external electric field to form an internal electric field facing the second direction D2 (e.g., the second direction D1 perpendicular to the first direction D1) (see FIG. 3A).

The at least one semiconductor layer 13 may be spaced apart from the plurality of conductor layers 12 by a second distance d2 in the second direction D2. The second distance d2 may be about 3 μm or more, for example, in a range of about 3 μm to about 10 μm, about 3 μm to about 8 μm, and/or about 3 μm to about 5 μm, but the present disclosure is not limited thereto.

The at least one semiconductor layer 13 may overlap each of at least two conductor layers 12 adjacent to each other among the plurality of conductor layers 12 in the second direction D2 crossing the first direction D1. At least one semiconductor layer 13 may be disposed between the at least two conductor layers 12 adjacent to each other and may have a first width w1 greater than the first distance d1 in the first direction D1. At least one semiconductor layer 13 may overlap each of at least two conductor layers 12 adjacent to each other in a second width w2 less than the first width w1. The first width w1 may be, for example, in the range of about 100 μm to about 1500 μm, about 200 μm to about 1400 μm, about 300 μm to about 1300 μm, and/or about 400 μm to about 1000 μm. The second width w2 may be about 1% or more of the first width w1, for example, in the range of about 1% to about 99%, about 15% to about 85%, and/or about 15% to about 70%. When the second width w2 is less than about 15% of the first width w1, a control effect of the dielectric constant or the capacitance may not be significant, but the second width w2 is not limited thereto and may be about 1%. For example, on a plane (e.g., a plane parallel to D1 and D3) with a normal line extending in the second direction D2, the at least one semiconductor layer 13 may overlap the at least two conductor layers 12 on about 1% or more of a planar area, for example, in the range of about 1% to about 99%, about 20% to about 80%, and about 30% to about 70%, but the present disclosure is not limited thereto (see FIGS. 2A and 2B).

The at least one semiconductor layer 13 may include a plurality of semiconductor layers 13. The plurality of semiconductor layers 13 may be spaced apart from each other by a predetermined (and/or otherwise set) distance (hereinafter referred to as a 'second third distance d3') in the first direction D1.

As illustrated in FIG. 2A, on a plane, the at least one semiconductor layer 13 and the plurality of conductor layers 12 may have a rectangular shape. However, a planar shape of the at least one semiconductor layer 13 and the plurality of conductor layers 12 is not particularly limited, and may be variously modified according to embodiments. For example, as illustrated in FIG. 2B, in the dielectric structure 10' of the modified example, the at least one semiconductor layer 13 and the plurality of conductor layers 12 may have a shape extending in one direction (e.g., a third direction D3) on a plane.

The at least one semiconductor layer 13 may include at least one of semiconductor materials, such as germanium (Ge), silicon (Si), gallium arsenic (GaAs), indium nitride (InN), silicon carbide (SiC), gallium nitride (GaN), aluminum nitride (AlN), and/or the like. The at least one semiconductor layer 13 may include, for example, polycrystalline silicon. The at least one semiconductor layer 13 may be provided in more or less numbers than those illustrated in the drawings according to the number of a plurality of conductor layers 12.

A dielectric constant or capacitance of the dielectric structure 10 according to example embodiments of the present disclosure may be adjusted by light. An internal carrier concentration of the at least one semiconductor layer 13 may be increased by light incident from the outside, and a stronger internal electric field may be induced between the at least one semiconductor layer 13 and the plurality of conductor layers 12 (see FIG. 3B). Furthermore, upon using the dielectric structure 10, a response speed (about tens of microseconds (μs) may be improved, and a variable capacitor capable of continuous impedance adjustment may be implemented.

The protective layers 14 and 15 may cover the plurality of conductor layers 12 and the at least one semiconductor layer 13 on the first surface S1 and the second surface S2 of the insulating layer 11. The protective layers 14 and 15 may include a first protective layer 14 disposed on the first surface S1 and a second protective layer 15 disposed on the second surface S2. The protective layers 14 and 15 may include a material having light-transmitting and insulating properties. The protective layers 14 and 15 may be formed using chemical vapor deposition, physical vapor deposition, atomic layer deposition, and/or the like. The protective layers 14 and 15 may include an insulating thin film layer (e.g., silica (SiO2)) deposited by a sputtering method. Since the protective layers 14 and 15 and the insulating layer 11 include a light-transmitting material, the carrier of the semiconductor layer 13 may be increased regardless of a direction of light.

Figure 3A:
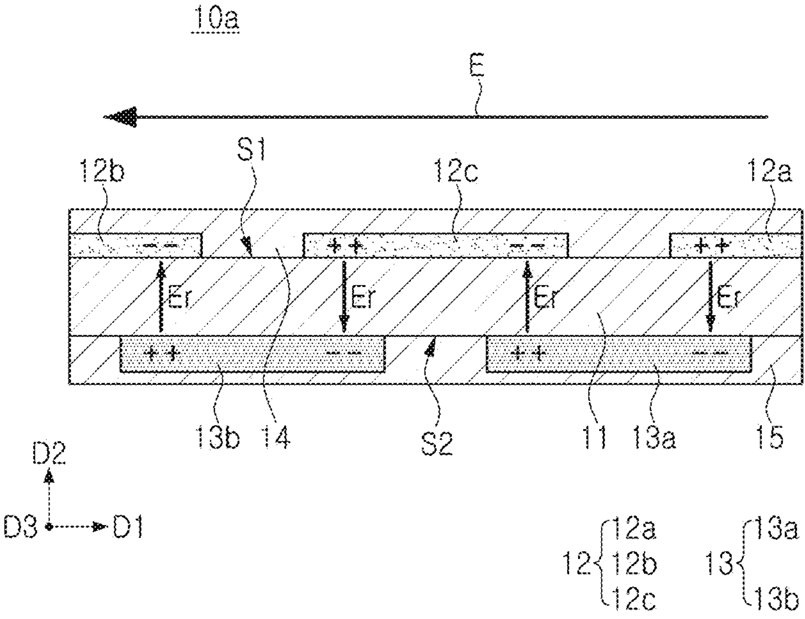
FIG. 3A is a plan view illustrating an electric field formed inside the dielectric structure of FIG. 1 in a light-off condition.
Figure 3B:
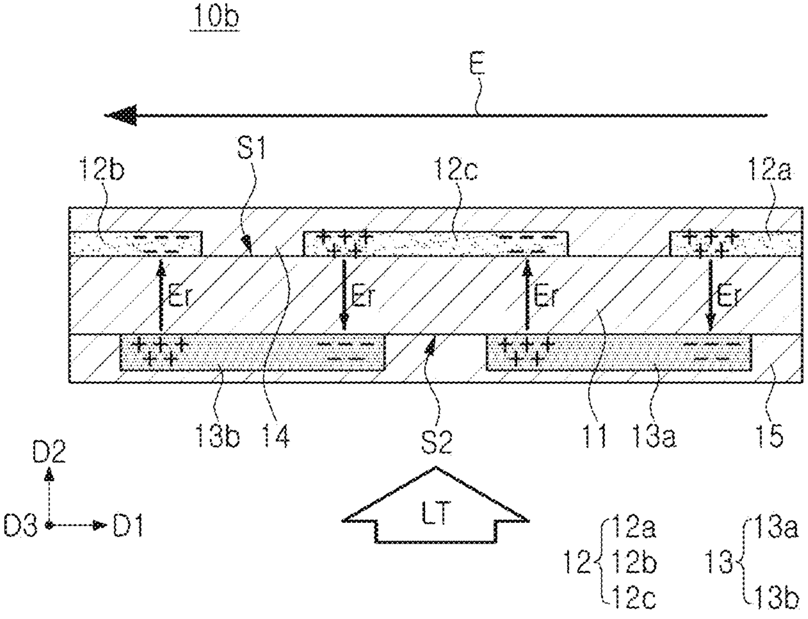
FIG. 3B is a plan view illustrating an electric field formed inside the dielectric structure of FIG. 1 in a light-on condition.
Figure 3C:
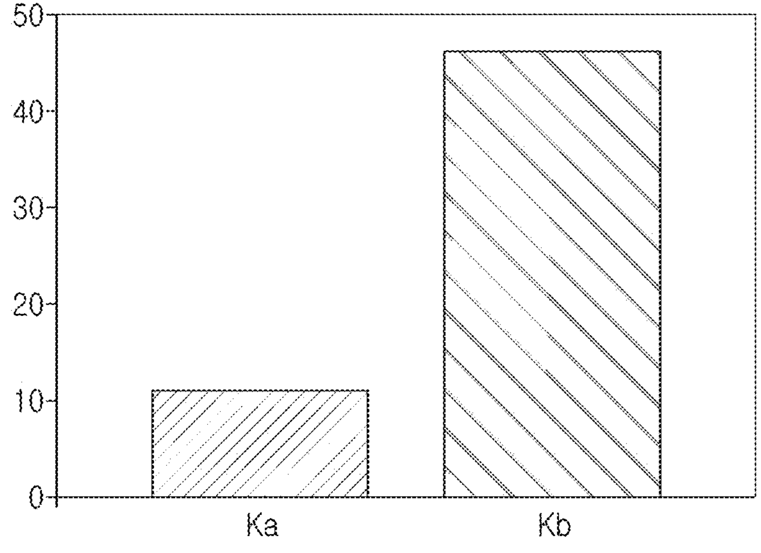
FIG. 3C is a graph illustrating a dielectric constant of the dielectric structure in FIGS. 3A and 3B.

FIG. 3A is a plan view illustrating an electric field Er formed inside the dielectric structure 10 of FIG. 1 in a light-off condition, FIG. 3B is a plan view illustrating an electric field Er formed inside the dielectric structure of FIG. 1 in a light-on condition, and FIG. 3C is a graph illustrating dielectric constants Ka and Kb of the dielectric structure in FIGS. 3A and 3B.

Referring to FIG. 3A, when an external electric field E in the first direction D1 is applied to a dielectric structure **10*a* in the light-off condition, a plurality of conductor layers 12, for example, a first conductor layer 12*a*, a second conductor layer 12*b*, and a third conductor layer 12*c* may induce adjacent semiconductor layers 13. The first semiconductor layer 13*a* and the second semiconductor layer 13*b* may be polarized by the first conductor layer 12*a*, the second conductor layer 12*b*, and the third conductor layer 12*c* overlapping each other. Accordingly, an internal electric field Er may be formed in one end of the first conductor layer 12*a* and the first semiconductor layer 13*a*, one end of the third conductor layer 12*c* and the other end of the first semiconductor layer 13*a*, one end of the second conductor layer 12*b* and the second semiconductor layer 13*b*, and the other ends of the third conductor layer 12*c* and the second semiconductor layer 13*b***.

Referring to FIGS. 3B and 3C, when the external electric field E in the first direction D1 is applied to a dielectric structure **10*b* in the light-on condition, the plurality of conductor layers 12 polarized by the external electric field E, for example, the first conductor layer 12*a*, the second conductor layer 12*b*, and the third conductor layer 12*c*, may induce polarization of adjacent semiconductor layers 13. The first semiconductor layer 13*a* and the second semiconductor layer 13*b* may be polarized by the first conductor layer 12*a*, the second conductor layer 12*b*, and the third conductor layer 12*c* overlapping each other. Since electrons and holes in the semiconductor layers 13 are increased by an incident light LT, a larger internal electric field Er may be induced as compared to the dielectric structure 10*a* in the light-off condition. Accordingly, as illustrated in FIG. 3C, a dielectric constant Kb (about 46.4) of the dielectric structure 10*b* in the light-on condition may be increased more than the dielectric constant Ka (about 11) of the dielectric structure 10*a*** in the light-off condition.

Figure 4:
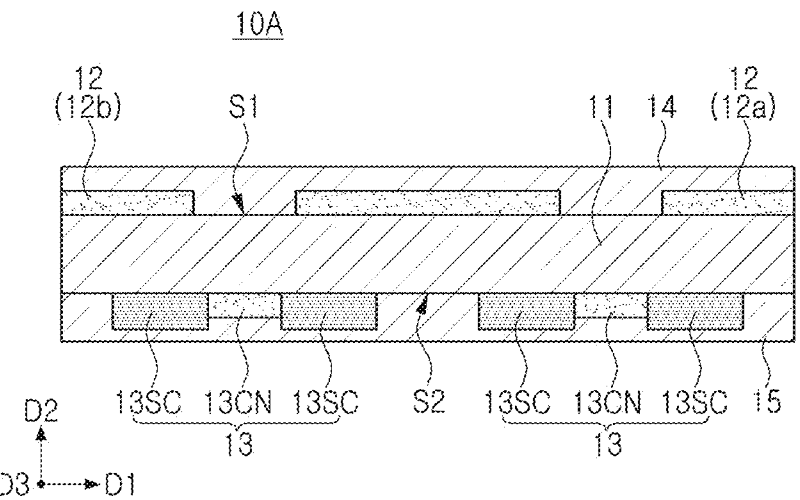
FIG. 4 is a cross-sectional view illustrating a dielectric structure according to at least one embodiment of the present disclosure.

FIG. 4 is a cross-sectional view illustrating a dielectric structure 10A according to at least one embodiment of the present disclosure.

Referring to FIG. 4, the dielectric structure 10A may have the same or similar characteristics as illustrated with reference to FIGS. 1 to 3C, except that the semiconductor layer 13 includes a semiconductor portion 13SC and a conductive connection portion 13CN.

The semiconductor portion 13SC may include semiconductor portions 13SC overlapped with the plurality of conductor layers 12 in the second direction D2 and spaced apart from each other in the first direction D1. The semiconductor portion 13SC may include at least one of semiconductor materials, such as germanium (Ge), silicon (Si), gallium arsenic (GaAs), indium nitride (InN), silicon carbide (SiC), gallium nitride (GaN), aluminum nitride (AlN), and/or the like. In at least one embodiment, the semiconductor unit 13SC may include, for example, polycrystalline silicon.

The connection portion 13CN may be disposed between the semiconductor portions 13SC spaced apart from each other in the first direction D1 and may electrically connect the semiconductor portions 13SC. The connection portion 13CN may include a conductive material, such as aluminum (Al), gold (Au), cobalt (Co), copper (Cu), nickel (Ni), lead (Pb), tantalum (Ta), tellurium (Te), titanium (Ti), tungsten (W), combinations thereof, and/or the like. The connection portion 13CN may be formed using a plating process, PVD, CVD, and ALD.

Figure 5:
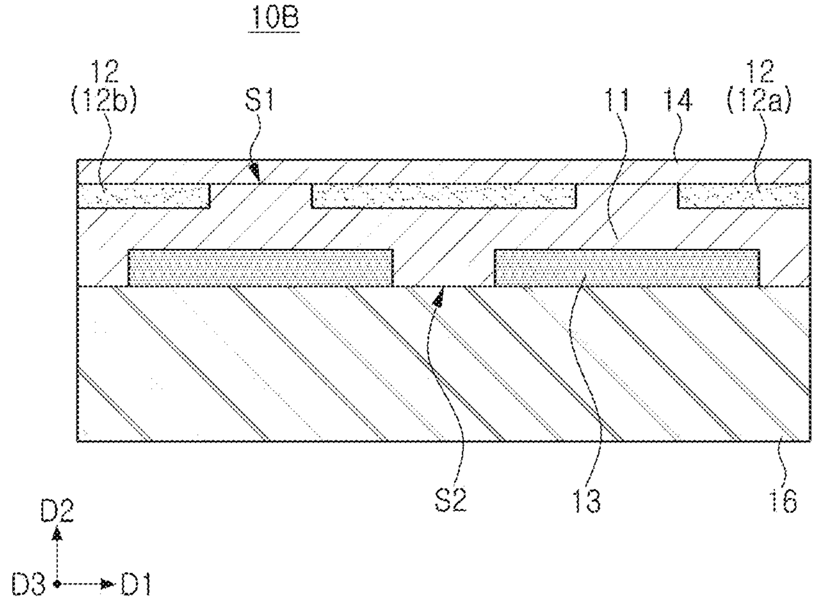
FIG. 5 is a cross-sectional view illustrating a dielectric structure according to at least one embodiment of the present disclosure.

FIG. 5 is a cross-sectional view illustrating a dielectric structure 10B according to at least one embodiment of the present disclosure.

Referring to FIG. 5, the dielectric structure 10B may have the same or similar characteristics as illustrated with reference to FIGS. 1 to 4, except that the dielectric structure 10B includes a light-transmitting substrate 16 replacing the second protective layer 15.

The light-transmitting substrate 16 may include, for example, fused silica, sapphire, and/or the like. The light-transmitting substrate 16 may have a thickness greater than that of the first protective layer 14, but the present disclosure is not limited thereto. One surface of the light-transmitting substrate 16 may be in contact with at least one semiconductor layer 13. The at least one semiconductor layer 13 disposed on one surface of the light-transmitting substrate 16 may be embedded in the second surface S2 of the insulating layer 11. According to at least one embodiment, the semiconductor layer 13 may have a lower surface in contact with the light-transmitting substrate 16, a side surface in contact with the insulating layer 11, and an upper surface in contact with the insulating layer 11. Furthermore, according to at least one embodiment, the plurality of conductor layers 12 may be embedded in the first surface S1 of the insulating layer 11. For example, the plurality of conductor layers 12 may have an upper surface in contact with the first protective layer 14, a lower surface in contact with the insulating layer 11, and a side surface in contact with the insulating layer 11.

Figure 6:
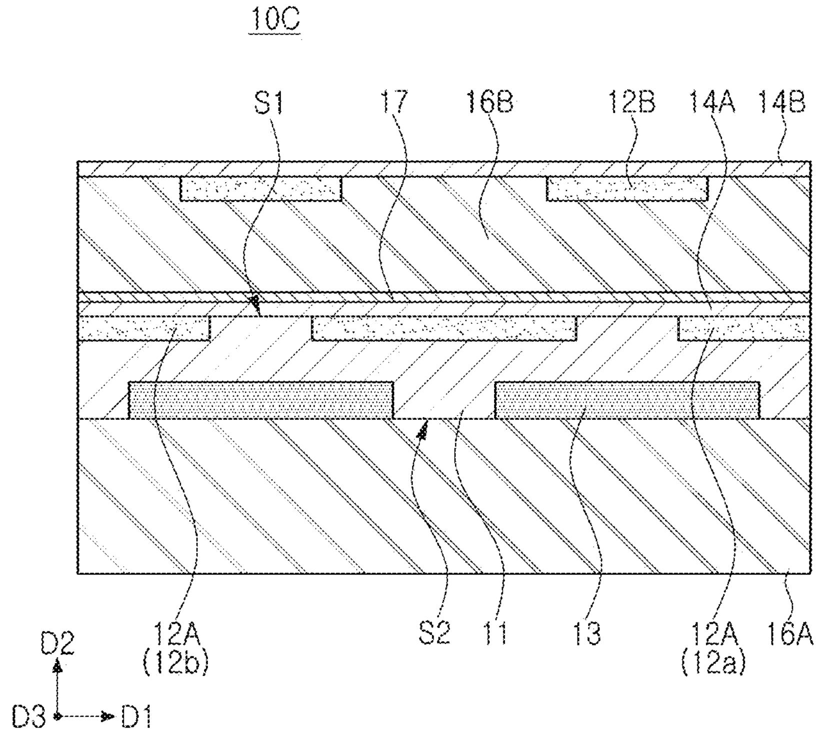
FIG. 6 is a cross-sectional view illustrating a dielectric structure according to at least one embodiment of the present disclosure.

FIG. 6 is a cross-sectional view illustrating a dielectric structure 10C according to at least one embodiment of the present disclosure.

Referring to FIG. 6, though the dielectric structure 10C is illustrated to coincide with the dielectric structure 10B, it will be recognized that the dielectric structure 10C may have the same or similar characteristics as illustrated with reference to FIGS. 1 to 5, except that the dielectric structure 10C further includes an upper insulating layer 16B and at least one upper conductor layer 12B. The dielectric structure 10C of the present embodiment may include a lower structure and an upper structure. The lower structure and the upper structure may be attached to each other by an optical adhesive film 17. The optical adhesive film 17 is disposed between the lower structure and the upper structure and may include a light-transmitting adhesive material, such as ceramic or polymer.

The lower structure may include a first light-transmitting substrate 16A, an insulating layer 11, lower conductor layers 12A, semiconductor layers 13, and a lower protective layer 14A. The light-transmitting substrate 16A, the lower conductor layers 12A, and the lower protective layer 14A may each have the same or similar characteristics as the light-transmitting substrate 16, the plurality of conductor layers 12, and the first protective layer 14 described above.

The upper structure may include a second light-transmitting substrate 16B (or an 'upper insulating layer'), upper conductor layers 12B, and an upper protective layer 14B. The second light-transmitting substrate 16B (or 'upper insulating layer') may include, for example, fused silica or sapphire. The second light-transmitting substrate 16B may have a thickness greater than that of the insulating layer 11, but the present disclosure is not limited thereto. At least one upper conductor layer 12B may be disposed on an upper surface of the second light-transmitting substrate 16B so as to reduce an impedance of the dielectric structure 10C. For example, at least one upper conductor layer 12B may overlap at least two upper conductor layers 12A disposed adjacent to each other in the second direction D2, and at least one semiconductor layer 13. The upper protective layer 14B may cover the at least one upper conductor layer 12B on the upper surface of the second light-transmitting substrate 16B. The upper protective layer 14B may include a material having light-transmitting and insulating properties. The upper protective layer 14B may include an insulating thin film layer (e.g., silica ($SiO_2$)) deposited by the sputtering method.

Figure 7A:
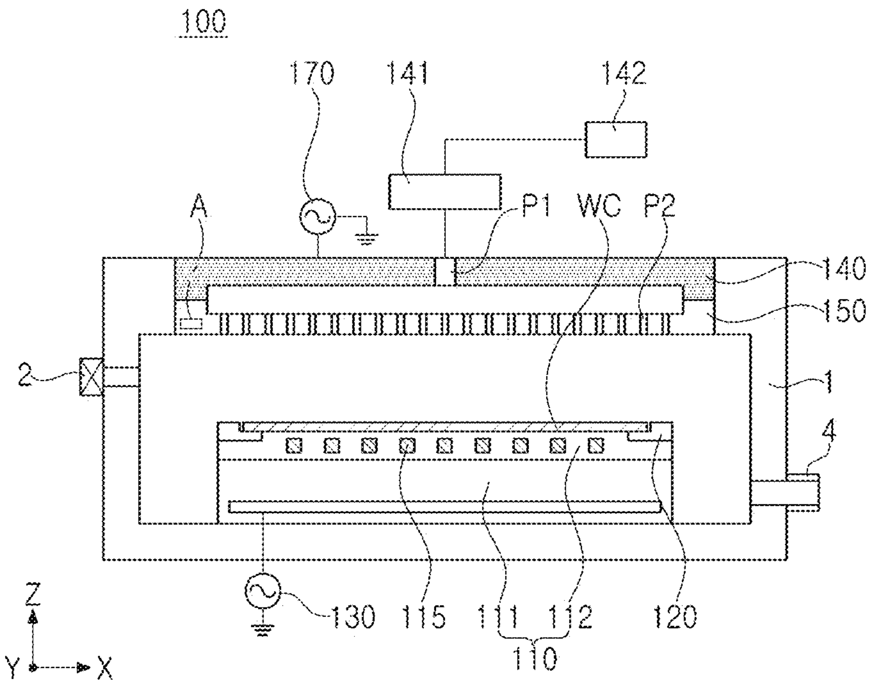
FIG. 7A is a cross-sectional view schematically illustrating a substrate processing apparatus according to at least one embodiment of the present disclosure.
Figure 7B:
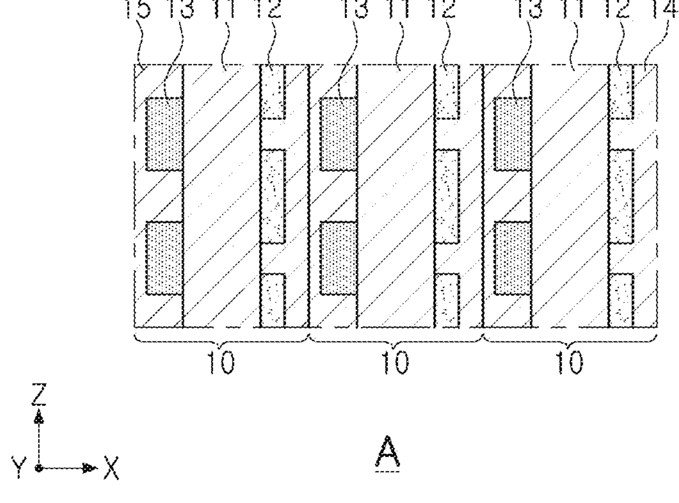
FIG. 7B is a partially enlarged view illustrating a region 'A' of FIG. 7A.

FIG. 7A is a cross-sectional view schematically illustrating a substrate processing apparatus 100 according to at least one embodiment of the present disclosure, and FIG. 7B is a partially enlarged view illustrating a region 'A' of FIG. 7A.

Referring to FIGS. 7A and 7B, a substrate processing apparatus 100 of at least one embodiment may include a support unit 110 and an edge ring 120 disposed in a lower portion of a chamber 1, and an upper electrode 140 and a shower head 150 disposed in an upper portion of the chamber 1.

The chamber 1 may provide a processing space of a substrate WC. The chamber 1 may include a gate 2 and a gas exhaust port 4 disposed on an external wall thereof. The gate 2 may be disposed on a sidewall of the chamber 1, and the substrate WC may be transferred to the inside of the chamber 1 or carried out to the outside of the chamber 1 by a transfer device. The gas exhaust port 4 may be disposed on the sidewall of the chamber 1 and connected to a pump (not illustrated) through which gas in the chamber 1 may be inhaled. The gas exhaust port 4 may be disposed under the chamber 1. The chamber 1 may further include a pump (not illustrated) for making an internal processing space into a vacuum state.

The support unit 110 may be disposed in the lower portion the chamber 1 and may face the shower head 150. The support unit 110 may include a lower plate 111 and an electrostatic chuck 112. The lower plate 111 may include a metal such as aluminum (Al), nickel (Ni), titanium (Ti), stainless steel, tungsten (W), alloys thereof, and/or the like. The lower plate 111 may have, for example, a cylindrical shape. The substrate processing apparatus 100 may further include a first power source 130 for applying a first RF power to the support unit 110. The first power source 130 may supply a radio frequency (RF) power to a lower electrode of the lower plate 111. The lower plate 111 may include (and/or function as) a lower electrode facing the upper electrode 140. The first power source 130 may supply a voltage having a frequency of, for example, 13.56 MHz, 27 MHz, or 40 MHz to the lower electrode. Although not illustrated, the lower plate 111 may further include a cooling device for cooling a wafer and a temperature sensor therein.

The electrostatic chuck 112 may be disposed on the lower plate 111. An upper surface of the electrostatic chuck 112 may be narrower than a lower surface of the electrostatic chuck 112. For example, a width of the lower surface of the electrostatic chuck 112 may be equal to a width of an upper surface of the lower plate 111, and a width of the upper surface of the electrostatic chuck 112 may be less than the width of the lower surface thereof. The electrostatic chuck 112 may include an adsorption electrode 115 therein. The electrostatic chuck 112 may include a dielectric material such as a ceramic and/or resin. The ceramic may include at least one of aluminum oxide ($Al_2O_3$), aluminum nitride (AlN), and yttrium oxide layer ($Y_2O_3$). The resin may include polyimide. The adsorption electrode 115 may be connected to a DC power source (not illustrated), and the substrate WC may be adsorbed and maintained on the electrostatic chuck 112 with constant power by a DC voltage supplied from the DC power source. The adsorption electrode 115 may include metals such as tungsten (W), copper (Cu), nickel (Ni), molybdenum (Mo), titanium (Ti), nickel-chromium alloys (Ni—Cr alloys), and nickel-aluminum alloys (Ni—Al alloys), and/or conductive ceramics such as tungsten carbide (WC), molybdenum carbide (MoC), and titanium nitride (TiN).

The edge ring 120 may be disposed on the electrostatic chuck 112 to surround a side surface of the substrate WC. For example, the edge ring 120 may have a ring shape or a donut shape surrounding an outer circumferential surface of the substrate WC. The edge ring 120 may have a staircase structure in which a lower portion thereof is larger than an upper portion thereof. The edge ring 120 may be provided to improve plasma uniformity during processing the substrate. That is, the edge ring 120 may prevent plasma from concentrating on the outer circumferential surface of the substrate WC in a processing process of the substrate WC using the plasma. The edge ring 120 may include quartz, sapphire, glass, ceramic, metal, or combinations thereof. According to example embodiments, the edge ring 120 may include a plurality of dielectric structures 10 according to example embodiments of the present disclosure (see FIG. 7B).

The upper electrode 140 may be disposed above the support unit 110 to face the lower electrode. A space between the upper electrode 140 and the lower electrode may be used as a plasma generation area. The upper electrode 140 may have a surface facing the substrate WC on the support unit 110. The upper electrode 140 may be supported by an insulation shielding member (not illustrated) in the upper portion the chamber 1. The upper electrode 140 may be provided as a portion of the shower head for supplying gas into the chamber 1. The upper electrode 140 may include a circular electrode plate. The upper electrode 140 may have a first hole P1 for supplying gas into the chamber 1. The substrate processing apparatus 100 may further include a flow rate controller 141 and a gas supply unit 142. The flow rate controller 141 may control a supply flow rate of gas flowing into the chamber 1. For example, the gas supply unit 142 may include a plurality of gas tanks, and the flow controller 141 may include a plurality of mass flow controllers (MFC) corresponding to each of the gas tanks. The mass flow controllers may independently control the supply flow rates of the gases.

The substrate processing apparatus 100 may further include a second power source 170 for applying a second RF power to the upper electrode 140. The second power source 170 may supply a radio frequency (RF) power to the upper electrode 140, and form plasma from a process gas in the chamber 1. The first power source 130 and the second power source 170 may be synchronized by the controller to excite the process gas inside the chamber 1 to the plasma.

The shower head 150 may be disposed between the upper electrode 140 and the support unit 110 (or the lower electrode). The shower head 150 supports the upper electrode 140 and may have a plurality of supply holes P2 for injecting gas supplied by passing through the upper electrode 140 into the chamber 1.

The substrate processing apparatus 100 according to at least one embodiment may include the shower head 150 comprised at least one of the dielectric structures 10, 10A, 10B, and 10C described with reference to FIGS. 1 to 6. As illustrated in FIG. 7B, the shower head 150 may include a plurality of dielectric structures 10 arranged in one direction (e.g., in a Z-direction). For example, the plurality of dielectric structures 10 may include a plurality of conductor layers 12 disposed on a first surface of the insulating layer 11 and spaced apart from each other in a first direction (e.g., the Z-direction) perpendicular to the upper electrode 140, at least one semiconductor layer 13 disposed on a second surface of the insulation layer 11 and overlapping each of at least two conductor layers 12 adjacent to each other among the plurality of conductor layers 12 in a second direction (e.g., an X-direction) perpendicular to the first direction (e.g., the Z-direction), and protective layers 14 and 15 respectively covering the plurality of conductor layers 12 and the at least one semiconductor layer 13. The substrate processing apparatus 100 may include at least one light source device (not illustrated) disposed in the chamber 1 and configured to irradiate light to the plurality of dielectric structures 10. Accordingly, the light may be irradiated to some or all areas of the shower head 150, thereby changing the capacitance of the shower head 150 and improving the asymmetry of the plasma.

In at least one embodiment, the substrate processing apparatus 100 may include (and/or be connected to) processing circuitry, such as hardware including logic circuits; a hardware/software combination such as a processor executing software; or a combination thereof, configured to control the operation of the substrate processing apparatus 100. For example, the substrate processing apparatus 100 may include at least one processor and memory storing instructions, which when executed by the at least processor, control the activation, timing, and/or intensity of the flow rate controller 141, the power sources 130 and 170, light source device, electrostatic chuck 112, etc.

The present disclosure is not limited to the above-described embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A plasma asymmetry control structure comprising:

a plurality of dielectric structures, each of the plurality of dielectric structures comprising an insulating layer extending in a first direction;

a plurality of conductor layers disposed on a first surface of the insulating layer such that the plurality of conductor layers are spaced apart from each other in the first direction;

at least one semiconductor layer on a second surface of the insulating layer, opposite to the first surface, and overlapping each of at least two adjacent conductor layers, among the plurality of conductor layers, in a second direction intersecting the first direction;

a first protective layer covering the plurality of conductor layers on the first surface of the insulating layer; and a second protective layer covering the at least one semiconductor layer on the second surface of the insulating layer, and wherein the plurality of dielectric structures are parallel to each other such that the first protective layer of at least one of the plurality of dielectric structures faces the second protective layer of a neighboring one of the plurality of dielectric structures.

2. The plasma asymmetry control structure of claim 1, wherein a planar area of a plane of the at least one semiconductor layer, with a normal line extending in the second direction, overlaps with the at least two adjacent conductor layers at about 30% to about 99%.

3. The plasma asymmetry control structure of claim 1, wherein the at least one semiconductor layer has a first width in the first direction and overlaps each of the at least two adjacent conductor layers with a second width less than the first width.

4. The plasma asymmetry control structure of claim 3, wherein the first width is within a range of about 400 μm to about 1000 μm.

5. The plasma asymmetry control structure of claim 3, wherein the second width is about 15% or more of the first width.

6. The plasma asymmetry control structure of claim 1, wherein the at least one semiconductor layer includes at least one of germanium (Ge), silicon (Si), gallium arsenic (GaAs), indium nitride (InN), silicon carbide (SiC), gallium nitride (GaN), or aluminum nitride (AlN).

7. The plasma asymmetry control structure of claim 1, wherein the at least one semiconductor layer has a width greater than a first distance between the at least two adjacent conductor layers.

8. The plasma asymmetry control structure of claim 7, wherein the first distance is within a range of about 40 μm to about 100 μm.

9. The plasma asymmetry control structure of claim 1, wherein the plurality of conductor layers and the at least one semiconductor layer are spaced apart from each other by a second distance in the second direction, wherein the second distance is about 3 μm to about 10 μm.

10. The plasma asymmetry control structure of claim 1, wherein a thickness of the plurality of conductor layers in the second direction is less than or equal to a thickness of the at least one semiconductor layer in the second direction.

11. The plasma asymmetry control structure of claim 1, wherein the plurality of conductor layers include at least one of aluminum (Al), gold (Au), cobalt (Co), copper (Cu), nickel (Ni), lead (Pb), tantalum (Ta), tellurium (Te), titanium (Ti), tungsten (W), or combinations thereof.

12. The plasma asymmetry control structure of claim 1, wherein the insulating layer, the first protective layer, and the second protective layer each include a light-transmitting material.

13. A plasma shower head comprising:

a plurality of dielectric structures arranged to define a plurality of holes such that the plurality of holes extend in a first direction, each of the plurality of dielectric structures comprising an insulating layer;

a plurality of conductor layers disposed on a first surface of the insulating layer such that the plurality of conductor layers are spaced apart from each other by a first distance in the first direction;

at least one semiconductor layer between at least two adjacent conductor layers, among the plurality of conductor layers, and on a second surface of the insulating layer, opposite to the first surface, the at least one semiconductor layer having a width greater than the first distance in the first direction;

a first protective layer covering the plurality of conductor layers on the first surface of the insulating layer; and a second protective layer covering the at least one semiconductor layer on the second surface of the insulating layer, and wherein the plurality of dielectric structures are parallel to each other such that the first protective layer of at least one of the plurality of dielectric structures faces the second protective layer of a neighboring one of the plurality of dielectric structures.

14. A plasma asymmetry control structure comprising:

a plurality of dielectric structures, each of the plurality of dielectric structures comprising an insulating layer;

a plurality of conductor layers disposed on a first surface of the insulating layer such that the plurality of conductor layers are spaced apart from each other in a first direction;

at least one semiconductor layer disposed on a second surface of the insulating layer, opposite to the first surface, and overlapping at least two adjacent conductor layers, among the plurality of conductor layers, in a second direction perpendicular to the first direction such that the at least one semiconductor layer and the at least two adjacent conductor layers are configured to form an internal electrical field when an external electric field is applied in the first direction; and a first protective layer and a second protective layers covering the plurality of conductor layers and the at least one semiconductor layer on the first surface and the second surface of the insulating layer, respectively, and wherein the plurality of dielectric structures are parallel to each other such that the first protective layer of at least one of the plurality of dielectric structures faces the second protective layer of a neighboring one of the plurality of dielectric structures.

15. The plasma asymmetry control structure of claim 14, wherein the at least one semiconductor layer comprises semiconductor portions overlapping the at least two adjacent conductor layers, respectively, and a connection portion connecting the semiconductor portions.

16. The plasma asymmetry control structure of claim 14, wherein the second protective layer on the second surface is a light-transmitting substrate thicker than the first protective layer on the first surface, and the at least one semiconductor layer is embedded in the second surface of the insulating layer.

17. The plasma asymmetry control structure of claim 16, wherein the light-transmitting substrate includes at least one of fused silica or sapphire.

18. The plasma asymmetry control structure of claim 16, wherein the plurality of conductor layers is embedded in the first surface of the insulating layer.

19. The plasma asymmetry control structure of claim 14, further comprising:

an upper insulating layer on the first protective layer;

an optical adhesive film between the first protective layer and the upper insulating layer;

at least one upper conductor layer on an upper surface of the upper insulating layer; and an upper protective layer covering the at least one upper conductor layer on the upper surface of the upper insulating layer.

20. The plasma asymmetry control structure of claim 19, wherein the at least one upper conductor layer overlaps the at least two adjacent conductor layers and the at least one semiconductor layer in the second direction.

* * * * *